United States Patent
Häring et al.

(10) Patent No.: US 12,339,162 B2
(45) Date of Patent: Jun. 24, 2025

(54) DEVICE AND METHOD FOR MEASURING SEMICONDUCTOR-BASED LIGHT SOURCES

(71) Applicant: Instrument Systems Optische Messtechnik GmbH, Munich (DE)

(72) Inventors: Reto Häring, Munich (DE); Christian Rixner, Tegernsee (DE); Florian Schewe, Munich (DE); Siegbert Sadowski, Irsee (DE); Angel Gavrailov, Kolbermoor (DE); Christian Dotzler, Baierbrunn (DE); Martin Mangstl, Munich (DE)

(73) Assignee: Instrument Systems GmbH, Munich (DE)

( * ) Notice: Subject to any disclaimer, the term of this patent is extended or adjusted under 35 U.S.C. 154(b) by 663 days.

(21) Appl. No.: 17/297,810

(22) PCT Filed: Nov. 27, 2019

(86) PCT No.: PCT/EP2019/082766
§ 371 (c)(1),
(2) Date: May 27, 2021

(87) PCT Pub. No.: WO2020/109399
PCT Pub. Date: Jun. 4, 2020

(65) Prior Publication Data
US 2021/0396575 A1     Dec. 23, 2021

(30) Foreign Application Priority Data
Nov. 27, 2018 (DE) .......................... 102018130006.9

(51) Int. Cl.
*G01J 1/44*     (2006.01)
*G01J 1/04*     (2006.01)
(Continued)

(52) U.S. Cl.
CPC ............... *G01J 1/44* (2013.01); *G01J 1/0425* (2013.01); *G01J 1/1626* (2013.01);
(Continued)

(58) Field of Classification Search
CPC .......... G01J 1/44; G01J 1/0425; G01J 1/1626; G01J 2001/0481; G01J 2001/1636;
(Continued)

(56) References Cited

U.S. PATENT DOCUMENTS 4,921,351 A * 5/1990 Kohigashi ............ G01N 21/474
                                                              356/323
6,154,277 A * 11/2000 Snelling ............. G01N 15/0205
                                                              356/336
(Continued)

FOREIGN PATENT DOCUMENTS

JP       2004219203 A * 8/2004 ............ G01M 11/00
MY      162204 A * 5/2017 ............. H01S 3/092

OTHER PUBLICATIONS

Beatriz Morales-Cruzado, Francisco G. Pérez-Gutiérrez, Dirk Frederik de Lange, and Ricardo Romero-Méndez, "Study of the effect introduced by an integrating sphere on the temporal profile characterization of short laser pulses propagating through a turbid medium," Appl. Opt. 54, 2383-2390 (2015) (Year: 2015).*
(Continued)

*Primary Examiner* — Michelle M Iacoletti
*Assistant Examiner* — Noah J. Haney
(74) *Attorney, Agent, or Firm* — Adams & Reese LLP; John Henry Scott, III (57) ABSTRACT

Methods and devices for the sequential measurement of a plurality of semiconductor-based light sources that operate faster, more accurately and more sensitively than known methods and devices. In accordance with one implementation, a current pulse is applied by a pulsed current source to the low-luminosity light sources consecutively or simultaneously. The emitted light pulse of LED is converted into electric charge carriers by a photodiode, the electric charge carries are added up by means an integrator circuit, the added-together charge carriers are converted by an A/D converter into a digital signal and the digital signal is forwarded to a measurement and control unit.

17 Claims, 6 Drawing Sheets

(51) Int. Cl.
*G01J 1/16* (2006.01)
*G01J 1/42* (2006.01)
*G01R 31/26* (2020.01)

(52) U.S. Cl.
CPC .............. *G01R 31/2635* (2013.01); *G01J 2001/0481* (2013.01); *G01J 2001/1636* (2013.01); *G01J 2001/4252* (2013.01); *G01J 2001/446* (2013.01)

(58) Field of Classification Search
CPC ........ G01J 2001/4252; G01J 2001/446; G01R 31/2635
USPC ......................................................... 356/236
See application file for complete search history.

(56) References Cited

U.S. PATENT DOCUMENTS

| | | | | |
|---|---|---|---|---|
| 6,222,172 | B1* | 4/2001 | Fossum | G01J 1/08 250/228 |
| 2003/0011767 | A1* | 1/2003 | Imura | G01J 3/28 356/326 |
| 2003/0058433 | A1* | 3/2003 | Almogy | G01N 21/9501 356/237.1 |
| 2011/0080113 | A1* | 4/2011 | Nguyen Hoang | G01R 31/2635 315/291 |
| 2011/0084701 | A1* | 4/2011 | Bancken | G01R 31/2635 324/414 |
| 2011/0195531 | A1* | 8/2011 | Sohn | H01L 22/10 356/416 |
| 2012/0249776 | A1* | 10/2012 | Ji | G01R 31/2635 348/125 |
| 2013/0201321 | A1 | 8/2013 | Chao et al. | |
| 2015/0342495 | A1* | 12/2015 | Davis | A61B 3/0008 351/221 |
| 2016/0020155 | A1* | 1/2016 | Kim | G01R 31/2635 438/16 |
| 2016/0316411 | A1 | 10/2016 | Jung et al. | |
| 2016/0334285 | A1* | 11/2016 | Celikel | G01J 1/4257 |
| 2017/0090019 | A1 | 3/2017 | Slobodyanyuk et al. | |

OTHER PUBLICATIONS

PCT International Search Report from priority PCT Application No. PCT/EP2019/082766; mailed Jun. 8, 2020; 4pp.

Bureev, Yu. K. et al; "A High-Frequency Photometer"; 2353 Measurement Techniques; Translated from Izmeritel'naya Tekhnika; Dec. 1992; No. 12; pp. 1402-1404 (previously pp. 30-31).

Corder, D.A. et al.; "A Novel Method for Energy Measurement of Short Optical Pulses"; Meas. Sci. Technol.; 8; 1997; pp. 1034-1040.

* cited by examiner

DEVICE AND METHOD FOR MEASURING SEMICONDUCTOR-BASED LIGHT SOURCES

The invention relates to a method for measuring a plurality of semiconductor-based light sources such as LEDs, OLEDs or VCSELs, in particular comparatively low-luminosity light sources such as so-called micro-LEDs. The invention further relates to a device for carrying out the method.

In the rapidly advancing development of semiconductor-based light sources, the dimensions of the individual semiconductor-based light sources are becoming ever smaller, in particular when using micro-LEDs for a wide range of displays, while at the same time the number of semiconductor-based light sources required for the respective application is steadily increasing. Furthermore, as the dimensions of semiconductor-based light sources decrease, the light intensity of the individual semiconductor-based light sources is also decreasing. In production lines of semiconductor-based light sources, such as LED displays, for example, the product parameters are measured by means of short light pulses for characterization. To organize the measurement of the individual semiconductor-based light sources as efficiently as possible, it is desirable to activate each individual semiconductor-based light source sequentially and to measure it individually.

An important parameter in the measurement is the conversion efficiency and/or output ratio, which are usually determined via the ratio of electric power to optical power or effect. To determine the conversion efficiency by means of fast current sources, a constant current is typically impressed for a brief period of less than 100 µs, preferably less than 10 µs or even less than 1 µs. Following stabilization lasting a few milliseconds, the optical and electrical measurement is triggered in the quasi-stable state. The measuring apparatus can be a photodiode for output measurement, a photometer for measuring the luminous flux or a spectroradiometer, in order to be able to measure colorimetric and special properties also.

In this process, the thermal loading of the semiconductor-based light sources in the measurement often presents a problem. The components are normally located on a wafer or in a small package, so that the thermal energy cannot be dissipated adequately. The duration of measurement is thereby limited before overheating may occur. The smaller the test item, the sooner the current supply has to be turned off again.

At the same time it is also necessary, however, to obtain a detectable and meaningful signal in the brief time periods. It is important here that the generation of the light pulse and the respective detection are synchronized to the highest degree.

Known measuring devices for individual optical pulses (e.g. laser amplifiers) are based mostly on pyroelectric sensors or thermopiles. These systems are very sluggish and too slow for LED applications. In a conventional measuring method using a photodiode, an output measurement of the light pulse is carried out by scanning. In the case of short signals in particular, a very high scanning rate must be selected to obtain a sufficiently precise result. At the same time, however, the signal/noise ratio is very small due to the high scanning rate. When using a spectroradiometer it is advantageous that the measured signals can also be evaluated spectrally. A disadvantage here, however, is the relatively slow measurement using a spectroradiometer. Moreover, the synchronization between current source and spectrometer is typically afflicted by a jitter between the measuring windows and the pulses, which contributes to the measuring error. The measurement is relatively insensitive on the whole and thus scarcely suitable for low-luminosity semiconductor-based light sources. The minimum measuring times are a few milliseconds on account of the readout times of the CCD or CMOS sensors used here.

An object of the present invention, therefore, is to provide a method that operates faster, more accurately and more sensitively than the known methods so that the sequential measurement of the radiation energy of a plurality of comparatively low-luminosity semiconductor-based light sources can be carried out in the time as short as possible.

The invention achieves this object in that the optical pulses are converted by means of a photodiode into electric charge carriers, the electric charge carriers are added up by means of an integrator circuit, the charge carriers that are added up are converted by means of an A/D converter into a digital signal and the digital signal is forwarded to the evaluation unit. In this case the conversion efficiency is not determined as usual from the ratio of electric power to optical power, but from the ratio of electric energy to optical energy. For this purpose, the charge produced by the photodiode is added by the integrator circuit and converted by means of calibration into optical energy. The electric power or energy is calculated from the product of the (relatively constant) forward bias at the semiconductor-based light source and the impressed current or the charge.

A preferred embodiment of the invention provides that the optical pulses are generated such that a current pulse is applied to a plurality of light sources simultaneously or consecutively by means of a pulsed current source. Precise activation and synchronization is possible in a particularly satisfactory manner due to the use of a pulsed current source.

A further development of the invention provides that, by means of a comparator circuit connected in parallel to the integrator circuit, triggering takes place by each light pulse of the semiconductor-based light source. Due to triggering by means of the comparator circuit connected in parallel, sequential activation is possible at a frequency up to the MHz range (>100 kHz, preferably >1 MHz) with simultaneous detection of only few charge carriers in the extremely short measuring windows. Compared with the known methods with scanning photodiodes, a better signal/noise ratio is thus achieved with very high sensitivity. Compared with the known methods with a spectroradiometer, distortions of the measuring results due to jitter are avoided in principle, shorter measuring times are possible and the required electronics are less expensive and more robust.

It is advantageous if the generation and the measurement of the optical pulses is controlled in a synchronized manner. Due to this measure, the precise assignment of the individual light sources is possible, so that the assignment of the measuring result to each individual light source is always reproducible. At the same time, jitter is further excluded by the synchronization.

It can be advantageous, furthermore, if the light sources are not measured individually, but sequentially in groups of light sources. Measurement is further accelerated hereby.

A further development of the invention provides that an Ulbricht sphere is used to detect the radiated light pulse of the light source. It would be possible in principle, but very expensive, to observe the light source from all possible directions with a photodiode and to calculate the entire luminous flux as the sum of the portions emitted in the individual directions. Only the luminous flux itself and not the distribution of direction is typically of interest, however.

Due to the integrative effect of the Ulbricht sphere, the originally unevenly distributed light intensity radiated by the individual light source from all directions is homogenized and permits simple measurement of a signal that is proportional to the luminous flux. The integrative effect results in the illuminance measured at the outlet being directly proportional to the overall luminous flux injected. The time profile of an irradiated light pulse is admittedly lost here, because in the Ulbricht sphere a light pulse is split into very many single reflections, which reach the detector on different optical paths with different path lengths and with different run times. The signal measured at the photodetector corresponds to a convolution of the original temporal pulse profile with the distribution profile of the run times. The pulses are thus temporally elongated in the Ulbricht sphere, which is relevant in the case of very short pulse durations in the ns range.

As an alternative to using an Ulbricht sphere to detect the radiated light pulse of the light source, it is expedient to use imaging optics to measure the entire light pulse with just one photodiode. In this configuration the sensitivity is even higher. Run time differences such as could occur with the Ulbricht sphere are prevented by the simple defined beam path, which is relevant with pulse durations in the ns range.

An alternative further development of the invention provides that an outlet opening is incorporated opposite the inlet opening of the Ulbricht sphere. The diameter of the outlet opening is selected here such that only a portion of the irradiated light pulse can exit the Ulbricht sphere again through the outlet opening, the remaining portion being reflected on the internal wall and homogenized as described above by multiple reflection. The portion of the light pulse that exits the Ulbricht sphere again through the outlet opening can be measured by a detector. The detector can be located directly in the outlet opening or also behind the outlet opening. Imaging optics with which the portion of light leaving the Ulbricht sphere can be imaged onto the detector can be located between the outlet opening and the detector. The light can also be coupled using coupling optics into a light-conducting fiber, however, and forwarded by the light-conducting fiber to the detector. The light can be measured integratively or in a time-resolved manner. It is thus possible to measure the luminous flux and the time-resolved profile of the pulse simultaneously.

It is also useful for a transimpedance amplifier to be connected between the photodiode and integrator circuit. The weak current detected by the photodiode is amplified by the transimpedance amplifier into a voltage proportional to the light pulse, so that more precise evaluation is possible.

In addition to the method described above, the invention also relates to a corresponding device.

To achieve the above object, the invention thus proposes a device for the sequential measurement of a plurality of optical pulses, with a pulsed current source, a photodiode, an integrator circuit, an A/D converter and a measurement and control unit that is configured to execute the method described.

In modern applications of semiconductor light sources of the type mentioned above, the requirement exists to analyze the short pulse characteristics of the light sources. Here it is a question e.g. of determining the conversion efficiency with a short pulse duration in the range of less than one µs or even less than 100 ns or 50 ns. In parallel with this, it should be possible to analyze the averaged (over several pulses) radiation output as well as the spectral properties of the light sources or the light pulses generated.

To this end, the invention proposes a method in which, regardless of the manner described above of converting the light pulses into electric charge carriers by photodiode and integrator circuit, the pulsed light radiation enters an Ulbricht sphere via an inlet opening, a first portion of the light radiation that exits the Ulbricht sphere following interaction with the same through a first outlet opening is measured by means of a first detector and a second portion of the light radiation, which exits the Ulbricht sphere without interacting with it through a second outlet opening, is measured by means of a second detector.

The first portion of the light radiation has experienced the homogenizing interaction with the Ulbricht sphere and can expediently be analyzed by means of the first detector with regard to average magnitudes, i.e. magnitudes averaged over several optical pulses. The pulse shape of the short optical pulses changes on account of the interaction with the Ulbricht sphere, so that the short pulse characteristics of the light sources cannot be analyzed by means of the first detector, but radiometric magnitudes, such as the average radiation output, or photometric magnitudes, such as the luminous flux, probably can. The first detector can expediently be a spectrometer or a spectroradiometer as described above.

The second detector measures the light radiation without interaction with the Ulbricht sphere. Without interaction with the Ulbricht sphere, the temporal progression of the optical pulses remains unchanged. The second detector can thus expediently be used to measure the temporal progression of the single optical pulses. The second detector can comprise for this purpose a (fast) photodiode, an A/D converter connected thereto and a digital memory (e.g. storage oscilloscope), which records the temporal progression of the voltage and/or of the current of the photodiode, preferably with a temporal resolution of 10 ns or less, preferably 1 ns or less.

To ensure that the second portion of the light radiation does not have any interaction with the Ulbricht sphere, it is advisable to arrange the second outlet opening with reference to the central point of the Ulbricht sphere opposite the inlet opening. In this way the light radiation entering the Ulbricht sphere through the inlet opening passes directly, i.e. on a straight path, through the second outlet opening out of the Ulbricht sphere again without reflections occurring on the internal wall of the Ulbricht sphere.

As already described above, the optical pulses can expediently be generated in that a current pulse is applied respectively to an arrangement of a plurality of light sources simultaneously or consecutively by means of a pulsed current source. The light sources can be semiconductor-based light sources, such as LEDs, VCSELs or OLEDs, which are combined into arrays or modules.

With a short pulse duration of 100 ns or below, the temporal progression of the individual optical pulse deviates from a rectangular pulse, even if the underlying current pulse is rectangular. Detection of the temporal progression of the individual light pulse is therefore necessary to determine the conversion efficiency in the short-pulse regime of the respective light sources precisely. The conversion efficiency is usefully determined e.g. from the ratio of the electric energy impressed by the current pulse and the energy of the individual light pulse measured by means of the second detector.

The invention further proposes a device for the sequential measurement of a plurality of optical pulses, with an Ulbricht sphere, which receives pulsed light radiation via an inlet opening, wherein a first portion of the light radiation, which exits the Ulbricht sphere following interaction with the same through a first outlet opening, encounters a first detector arranged behind the first outlet opening, wherein a second portion of the light radiation, which leaves the Ulbricht sphere without interacting with the same through a second outlet opening arranged opposite the inlet opening with reference to the central point of the Ulbricht sphere, encounters a second detector arranged behind the second outlet opening, and with a measurement and control unit connected to the first and the second detector. The measurement and control unit is expediently configured to execute the method described above.

In a preferred configuration of the device according to the invention, the first and/or the second outlet opening is connected via an optical fiber to the first or second detector. Connection via optical fibers has the advantage that the detectors do not have to be arranged directly on the Ulbricht sphere. Error-prone free-beam sections are avoided.

In a preferred configuration, at least one optical fiber, for example the optical fiber that connects the first outlet opening to the first detector, can have an input and two outputs, the light radiation exiting the Ulbricht sphere through the first outlet opening being fed into the input and exiting the optical fiber through both outputs, to be precise with different intensities. Expressed another way, the intensity of the light radiation is apportioned in a certain predetermined ratio to the at least two outputs, for example in the ratio 1:99 or a 10:90. The dynamic range for measuring the light radiation can be expanded in this way. A (first or second) detector is preferably associated respectively with each of the outputs of the optical fiber. In this case one of the detectors measures the light radiation at high intensity and the other detector accordingly measures at lower intensity.

Exemplary embodiments of the invention are illustrated by means of the drawings and explained below. The drawings show in.

Figure 1:
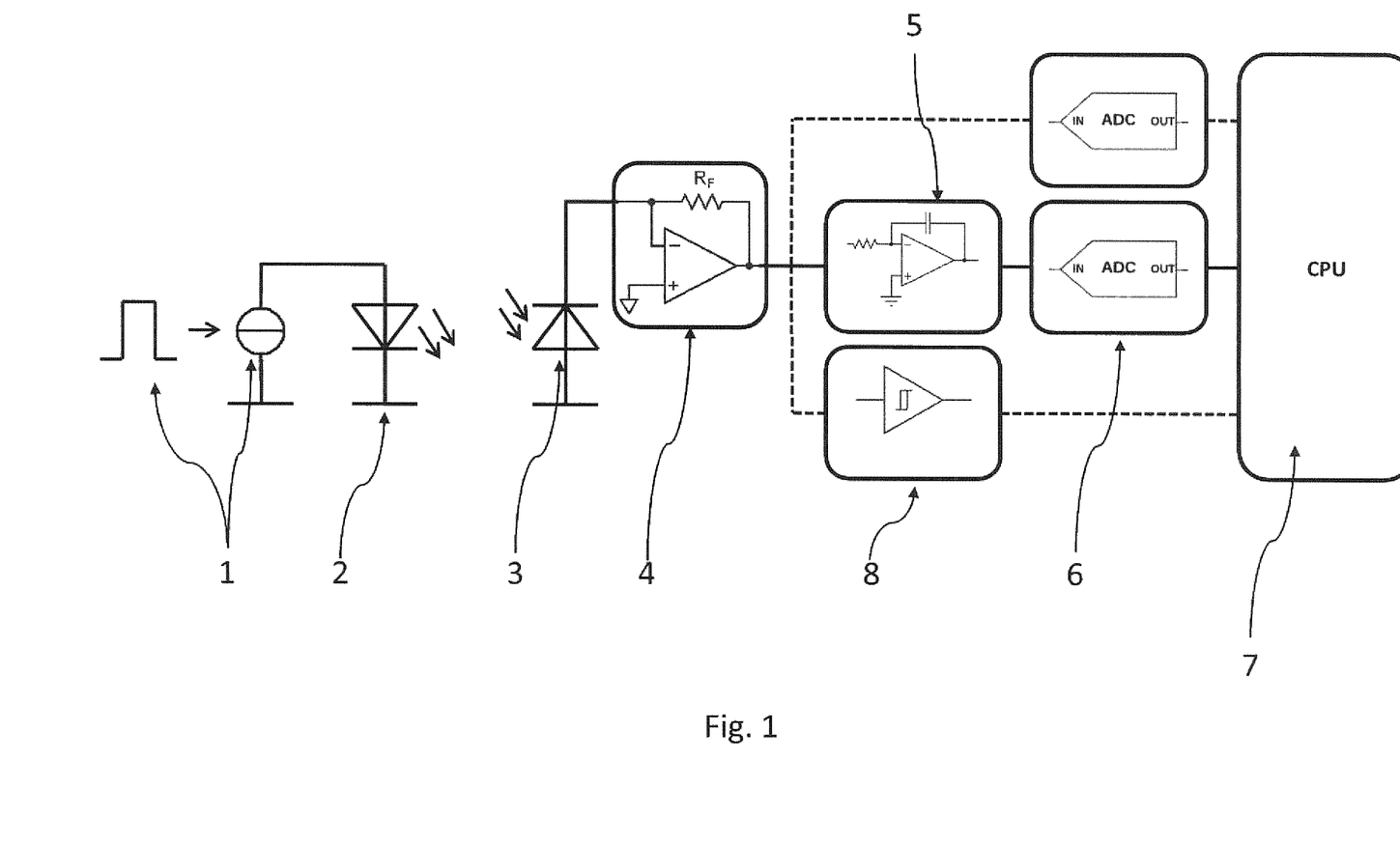
FIG. 1: an equivalent circuit diagram of a device according to the invention in schematic form.

In FIG. 1, a pulsed current source is identified by the reference character 1. The pulsed current source 1 applies a current pulse to an LED 2. The LED 2 to which the current pulse is applied emits a light pulse. The light pulse is detected by a photodiode 3 and converted into an electric current proportional to the light pulse. The current emitted by the photodiode 3 is converted via a transimpedance amplifier 4 into an amplified voltage proportional to the current. This voltage serves as an input voltage of an integrator circuit 5. The integrator circuit 5 adds up the charge at its capacitor. The charge added up by the integrator circuit 5 is thus proportional in relation to the energy of the light pulse. The analog signal tapped at the output of the integrator circuit 5 is converted via an A/D converter 6 into a digital signal and forwarded to a measurement and control unit 7. A comparator circuit 8 is additionally provided parallel to the integrator circuit 5. The comparator circuit 8 triggers a signal for both a rising and a falling pulse slope in the event of a threshold value that can be set in each case. This signal is then forwarded to the measurement and control unit 7. Via the adjustable threshold value of the comparator circuit 8, the pulse duration can be measured, for example, or a trigger realized for synchronization with another measuring apparatus or the current source.

Figure 2:
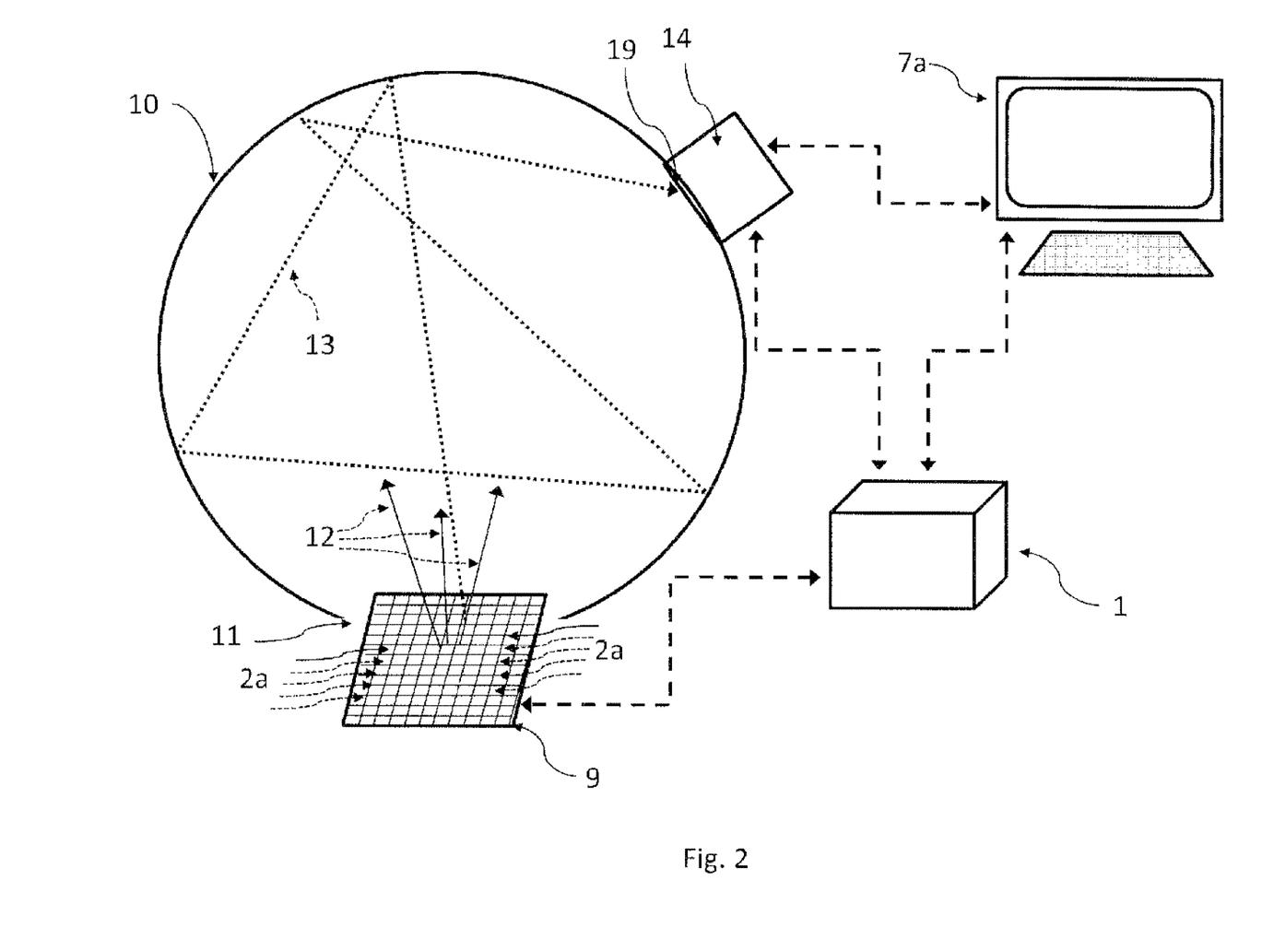
FIG. 2: a schematic view of a device according to the invention in a first embodiment.

FIG. 2 schematically depicts the setup for the application of a method according to the invention in a first embodiment. A test object with a plurality of micro-LEDs 2a, here a micro-LED display 9 (or a sub-module of such a display with at least a few thousand micro-LEDs), for example, is to be tested. Each micro-LED 2a of the micro-LED display 9 must be measured individually here. The micro-LED display 9 has up to several million micro-LEDs 2a. The following measuring setup is provided for the measurement: the micro-LED display 9 is arranged in or at the inlet opening 11 of an Ulbricht sphere 10. Provided at the outlet opening 19 of the Ulbricht sphere 10 is a detector module 14.

The detector module 14 includes the photodiode 3 depicted in FIG. 1, the transimpedance amplifier 4, the integrator circuit 5, the A/D converter 6. The measurement and control unit 7 from FIG. 1 is represented here by a PC 7a.

The micro-LED display 9, the PC 7a and the detector module 14 are each communicatively connected to the pulsed current source 1. Moreover, each individual micro-LED 2a of the micro-LED display 9 can be addressed via the pulsed current source 1, that is, applied with a current pulse. The PC 7a can consequently activate each individual micro-LED 2a via the communication interfaces and allocate the related measuring result based on this. The sequential measurement of the individual micro-LEDs 2a is carried out in the MHz range. The precise synchronization of current source 1, detector module 14 and PC 7a is of great importance, therefore.

If an individual micro-LED 2a of the micro-LED display 9 is now activated by the pulsed current source 1, the light pulse emitted tends to be of low luminosity on the one hand and on the other is also distributed in various spatial directions. Due to the integrative effect of the Ulbricht sphere 10, the weak, originally unevenly distributed light pulse radiated by the individual micro-LED 2a is collected from all directions and is convertible into an easily measurable illuminance that is related simply to the light pulse sought. The integrative effect leads to the illuminance measured at the outlet by the detector module 14 being directly proportional to the total light pulse injected. The detector module 14 now executes the steps described above (see FIG. 1) and supplies the digital measuring signal described to the PC 7a.

The next micro-LED 2a then has a current applied to it by means of the pulsed current source 1 via the communications interfaces. The frequency of the sequential measurement extends here from the kHz into the MHz range, thus many thousands to a few million micro-LEDs 2a can be measured within a short period.

Figure 3:
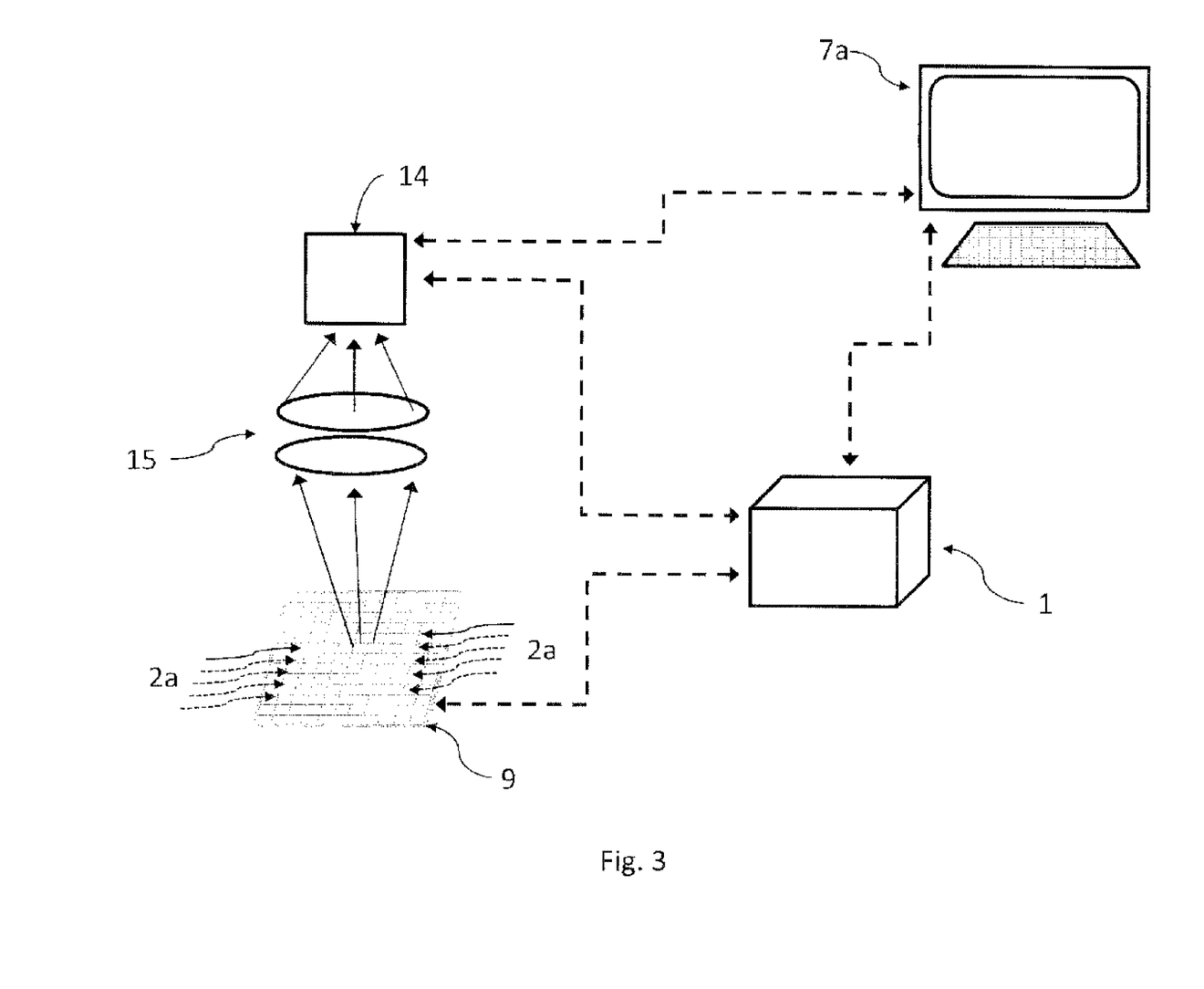
FIG. 3: a schematic view of a device according to the invention in a second embodiment.

FIG. 3 schematically depicts the setup for the application of a method according to the invention in a second embodiment. The setup is very similar to the setup in FIG. 2. Instead of the Ulbricht sphere 10 used in FIG. 2, imaging optics 15 are used in the second embodiment depicted in FIG. 3. The imaging optics 15 fulfil a similar purpose to the Ulbricht sphere 10 in FIG. 2. In this case, the light pulse radiated by the individual micro-LED 2a in various spatial directions is bundled by means of the imaging optics 15, so that the illuminance measured by the detector module 14 is as directly proportional as possible to the total light pulse of the individual micro-LED 2a. the following method steps correspond to those for the first embodiment.

Figure 4:
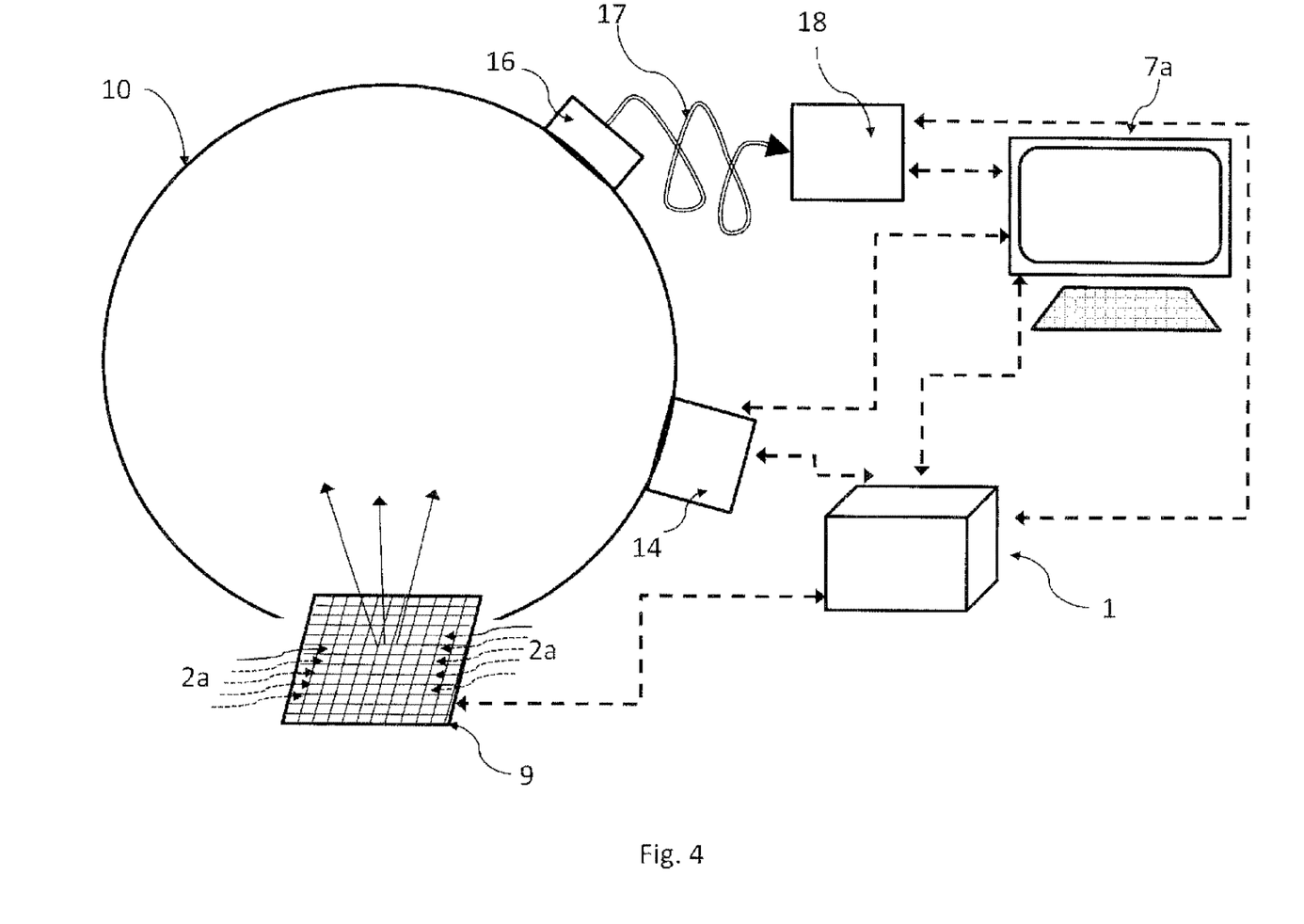
FIG. 4: a schematic view of a device according to the invention in a third embodiment.

In FIG. 4, the setup for the application of a method according to the invention in a third embodiment is depicted schematically. A spectrometer 18 is added to the setup from FIG. 2, so that the light pulses can be measured additionally or alone using the spectrometer 18. The light pulses homogenized by the Ulbricht sphere 10 are first injected by fiber optics 16 into a light-conducting fiber 17 and fed by said light-conducting fiber 17 into the spectrometer 18, in which the light pulses, disassembled into their spectral components, are imaged on a line or array detector, it being possible to measure the spectra of the light pulses with this detector. The measuring and readout processes of the aforementioned detector can be executed via the PC 7a or by trigger signals from the current source 1, for example; ideally the measuring and readout processes are synchronized with the generation of the light pulses. With this setup the spectra of the light pulses generated by a single light source 2a or a group of light sources 2a excited in parallel can be measured. Furthermore, a sequence of light pulses generated with successive current pulses can be measured spectrally by integration or averaging of the signal in the spectrometer 18 over several light pulses. A spectroradiometer is understood to be a combination of spectrometer 18 and coupling optics (e.g. fiber optics 16), for which absolute calibration exists in respect of wavelength and spectral detector sensitivity. This calibration can be stored e.g. on the PC 7a.

Figure 5:
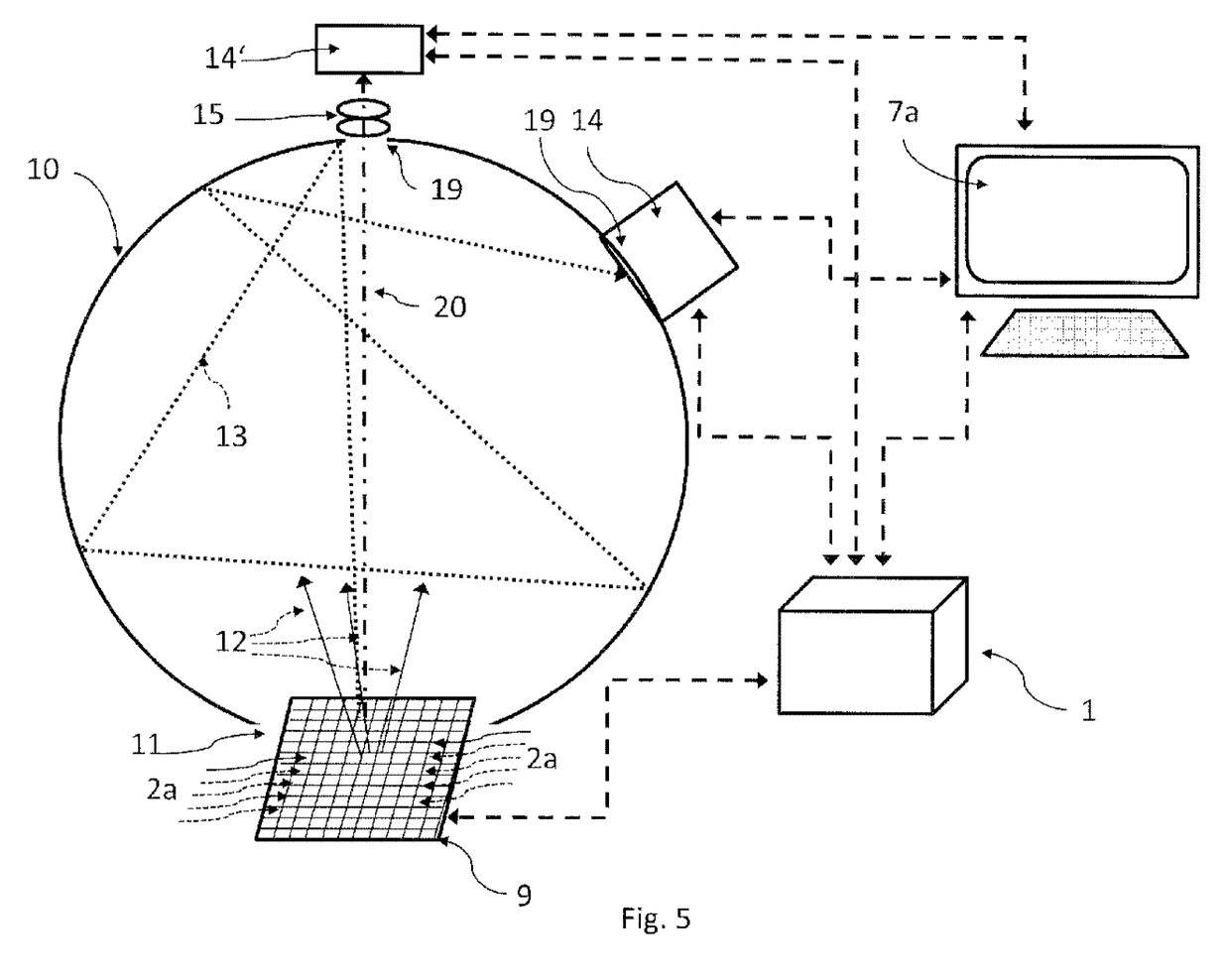
FIG. 5: a schematic view of a device according to the invention in a fourth embodiment.

FIG. 5 schematically depicts the setup for the application of a method according to the invention in a fourth embodiment. An outlet opening 19 is added to the setup from FIG. 2, so that a portion of the light pulses can be measured following multiple reflection 13 by the detector 14, and a portion of the light pulses can be measured following a single passage 20 through the Ulbricht sphere 10 without multiple reflection by another detector 14'. The detector 14' can be a fast photodiode, e.g. based on gallium phosphide, silicon, indium gallium arsenide or germanium. The detector 14' permits time-resolved measurement of the pulses. The detector 14' is connected to the current source 1 and synchronized. The light pulses 20 are imaged on the detector 14' by imaging optics 15.

Figure 6:
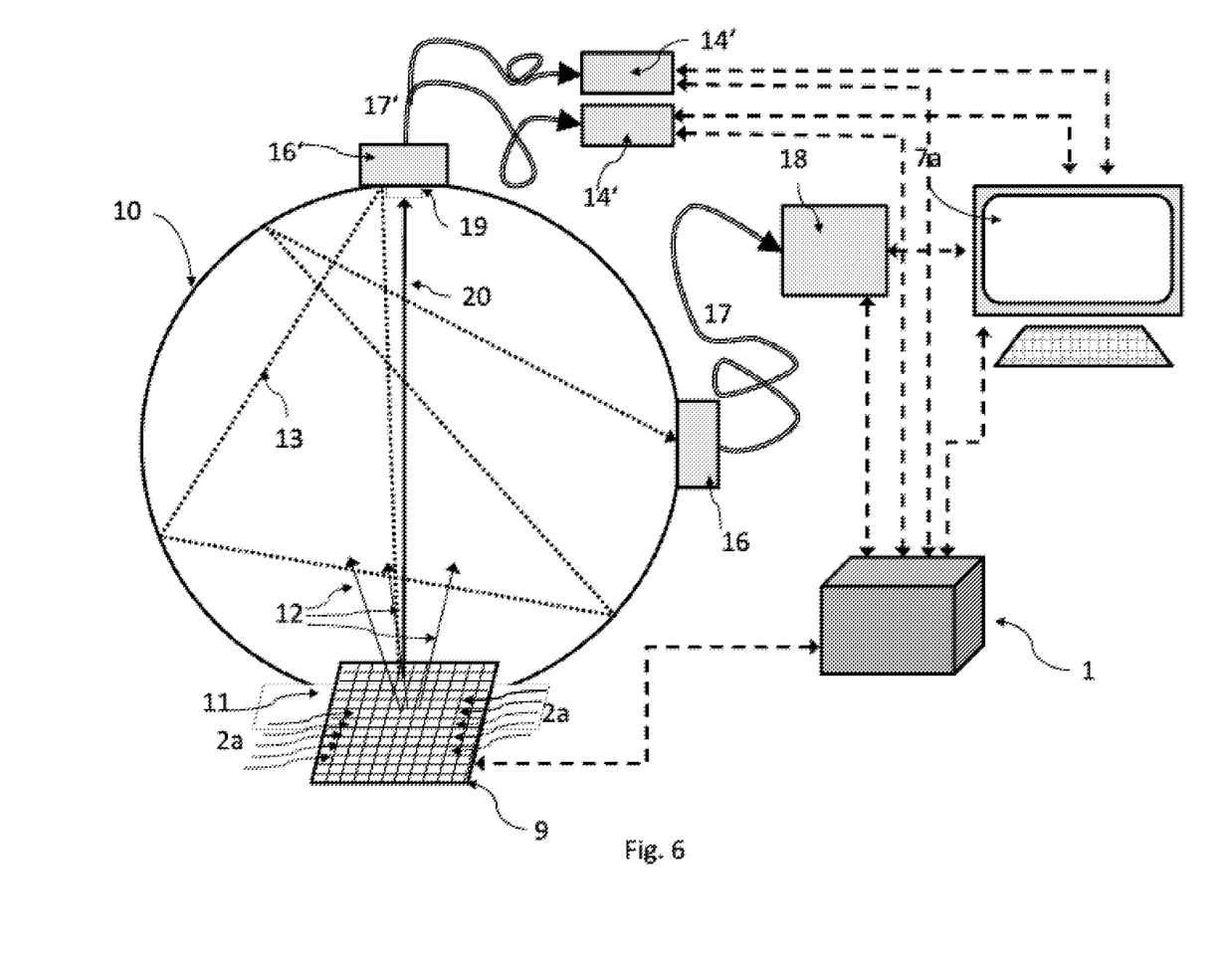
FIG. 6: a schematic view of a device according to the invention in a fifth embodiment.

In FIG. 6, a portion of the light pulses 13 homogenized by the Ulbricht sphere 10 are injected by means of fiber optics 16 into a light-conducting fiber 17 and fed by said light-conducting fiber 17 into the spectrometer 18, in which the light pulses, disassembled into their spectral components, are imaged on a line or array detector. The spectra of the light pulses are measured by this detector. The spectrometer 18 expediently has absolute calibration, so that relevant radiometric, photometric and colorimetric magnitudes can thereby be calculated by software from the spectral data. Another portion of the light pulses, which exits the Ulbricht sphere after passing directly through the Ulbricht sphere without interaction with the internal wall of the Ulbricht sphere, is coupled into further fiber optics 16' and injected via a light-conducting fiber 17' into a detector 14'. The detector 14' can be a fast photodiode, e.g. based on gallium phosphide, silicon, indium gallium arsenide or germanium. The detector 14' permits time-resolved measurement of the pulses, i.e. measurement of the temporal progression of the individual optical pulses (light intensity as a function of time). The detector 14' is connected to the current source 1 and thus synchronized. The light-conducting fiber 17' can be a fiber with one input and one output. The light-conducting fiber 17' can also be a fiber with one input and several outputs, however, as depicted, which feeds the injected light in equal or different intensity ratios into several second detectors 14'.

REFERENCE CHARACTER LIST

Current source
1 LED
2a Micro-LED
3 Photodiode
4 Transimpedance amplifier
5 Integrator circuit
6 A/D converter
7 Measurement and control unit
7a PC
8 Comparator circuit
9 Micro-LED display
10 Ulbricht sphere
11 Inlet opening
12 Irradiated light
13 Multiply-reflected beam
14 Detector module
14' Detector module
15 Imaging optics
16 Fiber optics
16' Fiber optics
17 Fiber
17' Fiber
18 Spectrometer
19 Outlet opening
20 Direct through-passage

The invention claimed is:

1. A method for the sequential measurement of a plurality of optical pulses, comprising:
emitting pulsed light radiation into an Ulbricht sphere via an inlet opening,
measuring a first portion of the pulsed light radiation, which exits the Ulbricht sphere following interaction with the same through a first outlet opening, by means of at least one first detector and
measuring a second portion of the pulsed light radiation, which exits the Ulbricht sphere without interaction with the same through a second outlet opening, by means of at least one second detector, which measures the temporal progression of the individual optical pulses, wherein the second detector comprises a photodiode, an A/D converter connected thereto and a digital memory, which records the temporal progression of the voltage and/or the current of the photodiode, and wherein the second detector detects the temporal progression with a temporal resolution of 10 ns or less.

2. The method of claim 1, wherein the second detector detects the temporal progression with a temporal resolution of 1 ns or less.

3. The method of claim 1, wherein the second outlet opening is arranged opposite the inlet opening with respect to the central point of the Ulbricht sphere.

4. The method of claim 1, wherein the first detector measures a radiometric parameter, such as the radiation output, and/or a photometric parameter, such as luminous flux.

5. The method of claim 1, wherein the first detector is a spectrometer.

6. The method of claim 1, wherein the first detector is a spectroradiometer.

7. The method of claim 1, wherein the optical pulses are generated by a current pulse being applied respectively to an arrangement of a plurality of light sources simultaneously or consecutively by means of a pulsed current source.

8. The method of claim 7, wherein the light sources are semiconductor-based light sources such as LEDs, VCSELs or OLEDs.

9. The method of claim 7, wherein the conversion efficiency of light sources is determined from the ratio of the electric energy impressed by a current pulse and the energy of the individual optical pulses measured by means of the second detector.

10. The method of claim 7, wherein the frequency of current pulses applied consecutively to the light sources is more than 100 kHz, and wherein the duration of an individual optical pulse is less than 1 µs.

11. The method of claim 7, wherein the frequency of current pulses applied consecutively to the light sources is more than 1 MHz and wherein the duration of an individual optical pulse is less than 1 µs.

12. The method of claim 7, wherein the frequency of current pulses applied consecutively to the light sources is more than 1 MHz and wherein the duration of an individual optical pulse is less than 100 ns.

13. The method of claim 7, wherein the frequency of the current pulses which are applied consecutively to the light sources is more than 100 kHz, and wherein the duration of an individual optical pulse is less than 100 ns.

14. A device for the sequential measurement of a plurality of optical pulses, comprising: a pulsed current source, a photodiode, an integrator circuit, an A/D converter and a measurement and control unit which is configured to perform the method according to claim 1.

15. A device for the sequential measurement of a plurality of optical pulses, comprising:
   a pulsed current source configured to generate a current pulse being applied respectively to an arrangement of a plurality of light sources consecutively,
   an Ulbricht sphere, which receives pulsed light radiation via an inlet opening,
   wherein a first portion of the pulsed light radiation, which exits the Ulbricht sphere following interaction with the same through a first outlet opening, encounters a first detector arranged behind the first outlet opening,
   wherein a second portion of the pulsed light radiation, which exits the Ulbricht sphere without interaction with the same through a second outlet opening arranged opposite the inlet opening, encounters a second detector arranged behind the second outlet opening, and
   further comprising a measurement and control unit connected to the first and the second detector, whereby the measurement and control unit being configured to execute the method according to claim 1.

16. The device of claim 15, wherein the first and/or the second outlet opening is connected via an optical fiber to the first or second detector, respectively.

17. The device of claim 15, wherein an optical fiber comprises an input and at least two outputs, the pulsed light radiation exiting the outputs at different intensities, wherein each output of the optical fiber is assigned a first or second detector.

* * * * *